(12) United States Patent
Yamamoto

(10) Patent No.: US 6,187,102 B1
(45) Date of Patent: Feb. 13, 2001

(54) THERMAL TREATMENT APPARATUS

(75) Inventor: Hiroyuki Yamamoto, Hino (JP)

(73) Assignee: Tokyo Electron Limited, Tokyo-To (JP)

( * ) Notice: Under 35 U.S.C. 154(b), the term of this patent shall be extended for 0 days.

(21) Appl. No.: 09/449,776

(22) Filed: Nov. 26, 1999

(30) Foreign Application Priority Data

Nov. 26, 1998 (JP) ...................................... 335471

(51) Int. Cl.$^7$ ............................................... C23C 16/00
(52) U.S. Cl. .......................................................... 118/725
(58) Field of Search .................................... 118/715, 725

(56) References Cited

U.S. PATENT DOCUMENTS 5,029,554 * 7/1991 Miyashita et al. .................... 118/715

FOREIGN PATENT DOCUMENTS

| 62-245624 | * 10/1987 | (JP) . |
| 4-152515 | 5/1992 | (JP) . |
| 5-13353 | 1/1993 | (JP) . |
| 7-106255 | 4/1995 | (JP) . |
| 10-223538 | 8/1998 | (JP) . |

* cited by examiner

Primary Examiner—Jeffrie R. Lund
Assistant Examiner—Sylviar MacArthur
(74) Attorney, Agent, or Firm—Smith, Gambrell & Russell, LLP

(57) ABSTRACT

In a thermal treatment apparatus 1 wherein semiconductor wafers W are accommodated in a treatment region A within a thermal treatment furnace 3 for wafers and a furnace entrance 2 is sealed, then the wafers W are subjected to a thermal treatment with a predetermined treatment gas at a predetermined treatment temperature and pressure, a purge gas introduction pipe 29 is provided on the side of the furnace entrance 2 and also a throttle mechanism 30 is provided between the treatment region A and the furnace entrance 2 for accelerating a purge gas to a speed that is faster than the speed of diffusion of the treatment gas, to generate a counterflow that prevents the treatment gas introduced upwards into the treatment region A from intruding into the side of the furnace entrance 2. This makes it possible to restrain the adhesion of reaction by-products onto portions around the furnace entrance 2.

26 Claims, 6 Drawing Sheets

F I G. I

THERMAL TREATMENT APPARATUS

BACKGROUND OF THE INVENTION

1. Technical Field

The present invention relates to a thermal treatment apparatus for objects to be treated, including semiconductor wafers and other substrates.

2. Description of Related Art

During the process of fabricating objects such as semiconductor wafers, various types of thermal treatment apparatus are used for subjecting the semiconductor wafers, which are objects to be treated, to treatments such as chemical vapor deposition (CVD), diffusion, oxidation, or annealing. For CVD or thermal treatments under reduced pressures that are comparatively high, a thermal treatment apparatus (also called a vertical thermal treatment apparatus) is generally used, wherein a gas introduction portion and an exhaust portion are provided in a lower portion of a vertical reaction tube; semiconductor wafers held in a multi-layer stack within a wafer boat, which is a means for holding semiconductor wafers, are accommodated and sealed into a treatment region within this reaction tube; the treatment region is heated to a predetermined treatment temperature by a heater provided outside the reaction tube; and the semiconductor wafers are subjected to the predetermined thermal treatment at a predetermined treatment pressure, using the predetermined treatment gas.

Since the manifold is separated from the heater in such a thermal treatment apparatus and there are problems concerning the thermal durability of sealing members, such as O-rings, that form a seal between the manifold and the reaction tube, it is usual to cool the vicinity of the sealing members of the manifold. This cooling brings the temperatures of the inner surfaces of the manifold down to well below the treatment temperature. Thus components of the treatment gas condense onto the inner surfaces of the manifold in regions outside the treatment region within the reaction tube when they come into contact therewith, reaction by-products (also called deposits, with diffusion processing) adhere to the inner surfaces of the manifold, and particles are generated. This has an adverse affect on the treatment and, moreover, regular cleaning becomes necessary. In addition, in a process that uses a treatment gas that is toxic, such as arsenic, the presence of these reaction by-products would inevitably affect the health of the operators adversely, making countermeasures necessary.

In order to address this problem, a method of sublimating reaction by-products is used in a conventional thermal treatment apparatus, wherein the vapor pressure of the reaction by-products is increased by heating the manifold from the outside.

However, since a special heater must be attached to the outer side of the manifold of such a thermal treatment apparatus, this causes a number of problems such as the apparatus itself becomes complicated, it is difficult to heat all the parts of the manifold to the desired temperature, it is necessary to consider safety problems such as burn injuries, and the necessary increase in electricity consumption adversely impacts the environment. In processes using treatment gases that contain components such as arsenic compounds, furthermore, the vapor pressure of the arsenic that is a reaction by-product is low so that the above described heating method is not greatly effective in suppressing the deposition.

To solve this problem, a vertical thermal treatment apparatus such as that disclosed in Japanese Patent Application Laid-Open No. 10-223538 (published Aug. 21, 1998) has been proposed. This vertical thermal treatment apparatus is provided with a single cylindrical reaction tube that is closed at an upper end and open at a lower end, and a thermal treatment region is defined within this reaction tube. The configuration is such that objects to be treated by the thermal treatment are conveyed into and out of the interior of the cylindrical reaction tube, through the open lower end thereof. A known manifold is provided under the lower portion of the reaction tube, and a gas introduction portion for the treatment gas and an exhaust portion are provided in this manifold. The configuration is such that a gas supply pipe is provided to extend from the gas introduction portion to an upper portion of the cylindrical reaction tube, so that the treatment gas is supplied downward from the vicinity of the closed upper end of the cylindrical reaction tube towards the thermal treatment region. A cylindrical cover is provided on the inner side of the manifold, with an annular exhaust space being formed between the manifold and this cover. The treatment gas, which was supplied so as to flow downward through the thermal treatment region and subject the objects to be treated to the thermal treatment, enters the exhaust space and is exhausted through the exhaust portion. An inert gas supply pipe is connected to a lower side of the cover, an inert gas that is sent from this inert gas supply pipe into the manifold is made to flow upward through an annular gap formed between the cylindrical cover and an insulating cylinder disposed on the inner side thereof, preventing the thermal treatment gas that is flowing downward through the thermal treatment region from flowing into that annular gap, and this prevents components of the thermal treatment gas from coming into contact with the inner side of the manifold, thus preventing the adhesion of reaction by-products thereon.

The above described known vertical thermal treatment apparatus is certainly effective in preventing the adhesion of reaction by-products onto the interior of the manifold, but it has a defect in that, because the inert gas must be made to flow upward from the inert gas supply pipe against the resistance of the downflow of the thermal treatment gas flowing through the thermal treatment region, it is necessary to increase the speed of flow of the inert gas and, as a result, the flowrate of inert gas must be increased. If the flowrate of the inert gas is increased, a large quantity of the inert gas will mix with the thermal treatment gas in the thermal treatment region, adversely affecting the quality of the thermal treatment.

The present invention was devised in order to solve the above described problem and has as an object thereof the provision of a thermal treatment apparatus which is, of course, capable of restraining the adhesion of reaction by-products on portions around the furnace entrance within the manifold, but which also enables a reduction in the flowrate of inert gas, thus reducing the likelihood of inert gas mixing with the thermal treatment gas within the thermal treatment region while having no adverse effect on the quality of the thermal treatment. Another object of this invention is to provide a thermal treatment apparatus that ensures there is no peeling of any reaction by-products that happen to adhere thereto.

DISCLOSURE OF THE INVENTION

In order to achieve the above described objectives, the present invention provides a thermal treatment apparatus comprising: a thermal treatment furnace which has a vertical reaction tube and which is also provided in a lower portion thereof with a furnace entrance capable of being opened and closed to allow conveying in and out of objects to be treated, wherein the reaction tube has an outer tube that is closed at an upper portion but open at a lower portion and an inner tube which is provided within the outer tube, which forms a thermal treatment region therein and is also open at both upper and lower portions, and which forms together with the outer tube an annular space for exhausting a treatment gas in a downward direction; a treatment gas introduction pipe which is provided within the inner tube to introduce a treatment gas into the thermal treatment region and which also has at an upper end thereof a treatment gas introduction port for generating an upwardly directed flow of a treatment gas directed toward an upper portion of the inner tube through the thermal treatment region within the inner tube, wherein the upwardly directed flow of treatment gas performs a thermal treatment with respect to an object to be treated within the thermal treatment region, then is directed to flow downward within the annular space; a purge gas introduction pipe which is positioned at a lower portion of the inner tube and below the treatment gas introduction port, and on the upstream side with respect to the upwardly directed flow of treatment gas emitted from the treatment gas introduction port, for introducing a purge gas directed upward within the thermal treatment region; and a purge gas throttle mechanism provided between the thermal treatment region and the purge gas introduction pipe, for accelerating the purge gas introduced from the purge gas introduction pipe, thus generating counterflow in a direction opposite to a direction of diffusion of the treatment gas, at a speed that is faster than the speed at which the treatment gas introduced from the treatment gas introduction port into the thermal treatment region diffuses towards the furnace entrance, in order to prevent the treatment gas that has been introduced into the thermal treatment region from intruding into the furnace entrance.

To further achieve the above object, this invention also provides a thermal treatment apparatus comprising: a thermal treatment furnace which has a thermal treatment region therein and which is also provided with a furnace entrance that is capable of being opened and closed to allow conveying in and out of objects to be treated; a treatment gas introduction pipe for introducing a treatment gas into the thermal treatment region of the thermal treatment furnace; an exhaust system comprising an exhaust pipe for exhausting an interior of the thermal treatment furnace; and surface-roughened portions provided on an inner surface of the furnace entrance and an inner surface of the exhaust pipe, where it is assumed that reaction by-products of the treatment gas will adhere, to suppress peeling of the reaction by-products therefrom.

The above described characteristics of the thermal treatment apparatus in accordance with this invention can be used in combination.

To achieve the above described object even further, this invention provides a thermal treatment apparatus comprising: a thermal treatment furnace which has a vertical reaction tube that forms a thermal treatment region therein and which is also provided with a furnace entrance that is capable of being opened and closed to allow conveying in and out of objects to be treated; a treatment gas introduction pipe which is provided in an interior of the reaction tube for introducing a treatment gas into the thermal treatment region and which also has at an upper end thereof a treatment gas introduction port for generating an upwardly directed flow of a treatment gas directed toward an upper portion of the reaction tube through the thermal treatment region within the reaction tube, wherein the upwardly directed flow of treatment gas performs a thermal treatment with respect to an object to be treated within the thermal treatment region; a purge gas introduction pipe which is positioned at a lower portion of the reaction tube and below the treatment gas introduction port, and on an upstream side with respect to the upwardly directed flow of treatment gas emitted from the treatment gas introduction port, for introducing a purge gas directed upward within the thermal treatment region; and a purge gas throttle mechanism provided between the thermal treatment region and the purge gas introduction pipe, for accelerating the purge gas introduced from the purge gas introduction pipe, thus generating a counterflow in a direction opposite to the direction of diffusion of the treatment gas, at a speed that is faster than a speed at which the treatment gas introduced from the treatment gas introduction port into the thermal treatment region diffuses towards the furnace entrance, in order to prevent the treatment gas that has been introduced into the thermal treatment region from intruding into the furnace entrance.

To achieve the above described object yet further, this invention provides a thermal treatment apparatus comprising: a thermal treatment furnace which has a vertical reaction tube and which is also provided in a lower portion thereof with a furnace entrance that is capable of being opened and closed to allow conveying in and out of objects to be treated, wherein the reaction tube has an outer tube that is open at a lower portion and an inner tube which is provided within the outer tube, which forms a thermal treatment region therein and is also open at both upper and lower portions, and which forms together with the outer tube an annular space; a treatment gas introduction pipe which is provided within the inner tube to introduce a treatment gas into the thermal treatment region and which also has at an upper end thereof a treatment gas introduction port for generating an upwardly directed flow of a treatment gas directed toward an upper portion of the inner tube through the thermal treatment region within the inner tube; a purge gas introduction pipe which is positioned at a lower portion of the inner tube and below the treatment gas introduction port, and moreover on the upstream side with respect to the upwardly directed flow of treatment gas emitted from the treatment gas introduction port, for introducing a purge gas directed upward within the thermal treatment region; a purge gas throttle mechanism provided between the thermal treatment region and the purge gas introduction pipe, for accelerating the purge gas introduced from the purge gas introduction pipe, thus generating a counterflow in a direction opposite to a direction of diffusion of the treatment gas, at a speed that is faster than a speed at which the treatment gas introduced from the treatment gas introduction port into the thermal treatment region diffuses towards the furnace entrance, in order to prevent the treatment gas that has been introduced into the thermal treatment region from intruding into the furnace entrance; and an exhaust system connected to an upper portion of the outer tube.

DESCRIPTION OF THE PREFERRED EMBODIMENTS

Figure 1:
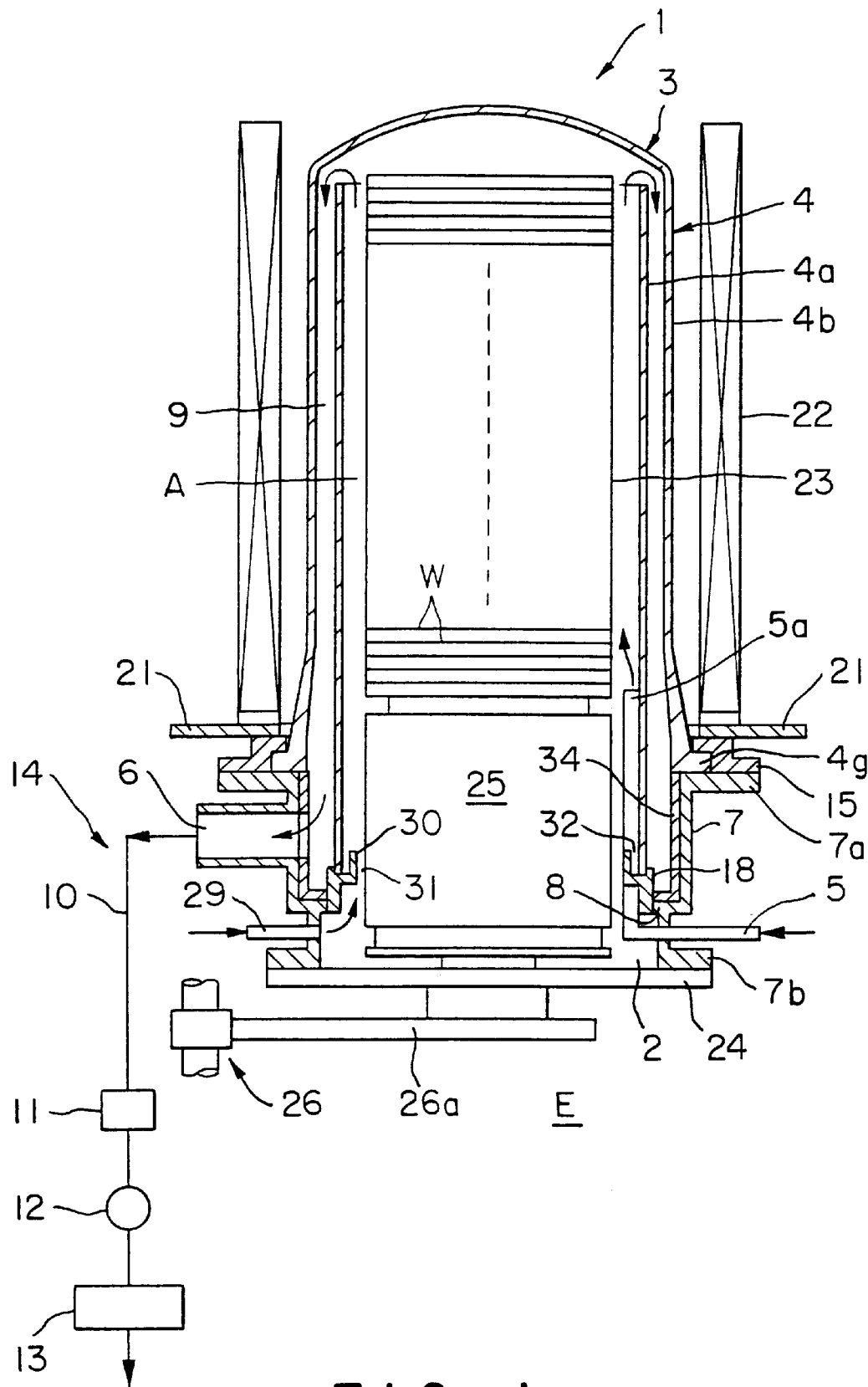
FIG. 1 is a vertical sectional view through an embodiment in which the present invention is applied to a vertical thermal treatment apparatus.
Figure 2:
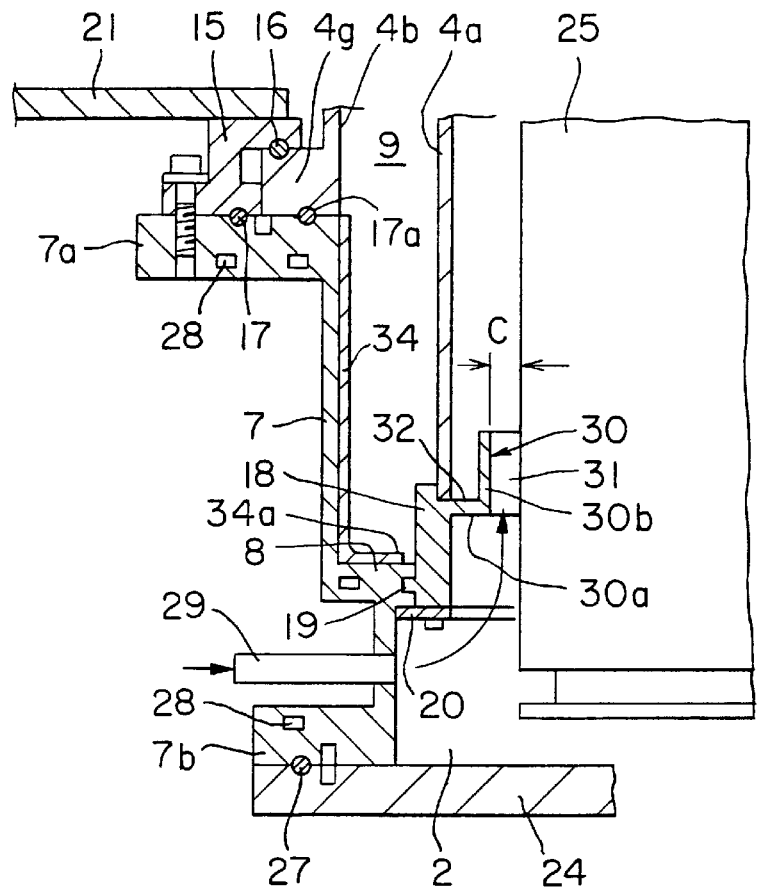
FIG. 2 is an enlarged section through essential components of the thermal treatment apparatus.
Figure 3A:
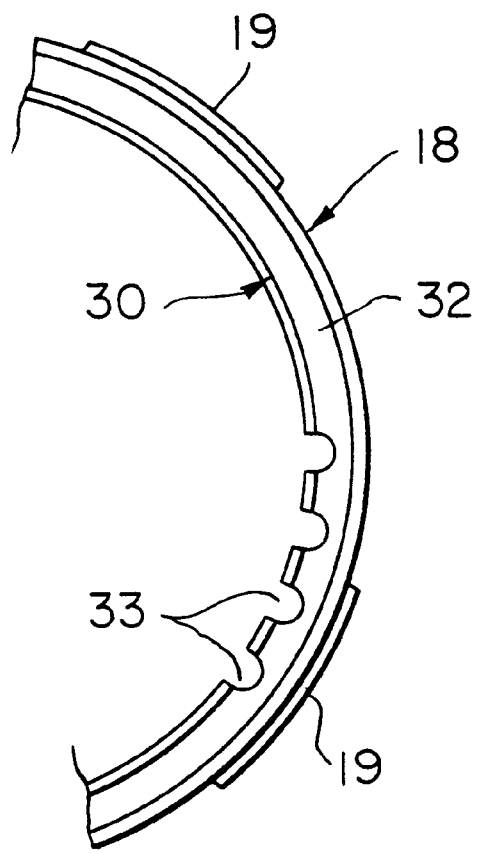
FIG. 3A is a partial plan view of an inner tube support member and a manifold.
Figure 3B:
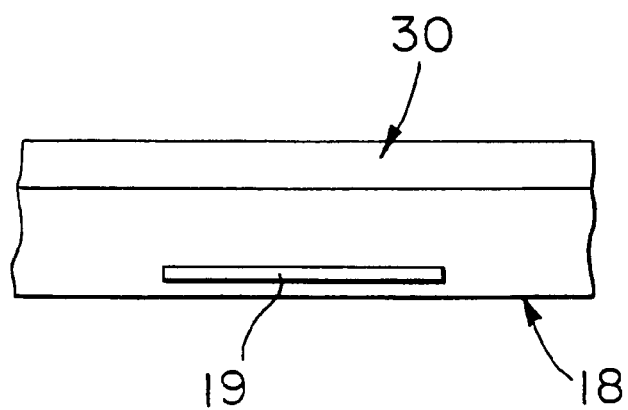
FIG. 3B is a partial side view of the inner tube support member of FIG. 3A.

Embodiments of the present invention will be described below with reference to the accompanying drawings. A vertical section through an embodiment wherein this invention is applied to a vertical thermal treatment apparatus is shown in FIG. 1 and an expanded view of essential components of this thermal treatment apparatus is shown in FIG. 2. A partial plan view of an inner tube support member is shown in FIG. 3A and a partial side view thereof is shown in FIG. 3B.

In FIG. 1, reference number 1 denotes a vertical thermal treatment apparatus configured to enable CVD or diffusion processing, where this thermal treatment apparatus 1 is provided with a thermal treatment furnace 3 having a furnace entrance 2. This thermal treatment furnace 3 is provided with a processing vessel that is a vertical reaction tube 4 made of quartz, gas introduction portions 5 provided in a lower end portion of the reaction tube 4 for introducing a treatment gas into a treatment region A within the reaction tube 4 (the same as a treatment region within a thermal treatment furnace), and a short cylindrical manifold 7 having an exhaust part 6 for exhausting gases from the treatment region A. The lower portion of the manifold 7 forms the furnace entrance 2. The reaction tube 4 has a double-tube structure comprising an inner tube 4a and an outer tube 4b. The inner tube 4a is opened at the upper and lower ends thereof. The outer tube 4b is closed at the upper end but open at the lower end thereof. An annular passageway 9 is formed between the inner tube 4a and the outer tube 4b for exhausting the treatment gas in the downward direction. The treatment gas that is introduced in the upward direction from the gas introduction pipe 5 passes through the treatment region A, flows downward through the annular passageway 9 between the inner tube 4a and the outer tube 4b, and is exhausted.

The manifold 7 is formed or a material having thermal durability and corrosion resistance, such as stainless steel. The gas introduction pipe 5 is formed from an L-shaped injector gas introduction pipe that passes in a hermetically sealed manner through a side wall of the manifold 7 below an inner flange portion 8 thereof, which will be described later, and is disposed upright along the inner wall of the inner tube 4a to cause the treatment gas to be introduced as an upward flow from a treatment gas introduction port 5a at the upper end of the gas introduction pipe into the treatment region A within the reaction tube 4. A plurality of gas introduction pipes 5 are provided in the peripheral direction around the manifold 7, corresponding to the kinds of gas. Note that a gas introduction pipe (not shown in the figure) that introduces a cleaning gas for cleaning the interior of the thermal treatment furnace 3 is preferably formed, not of an L-shaped injector pipe, but in such a manner that it guides a gas directly into the furnace entrance 2, in the same way as a purge gas introduction pipe that will be described later.

The exhaust part 6 is provided in such a manner as to communicate with the annular passageway 9 between the inner tube 4a and the outer tube 4b on the side wall of the manifold 7 at a position that is higher than the inner flange portion 8. An exhaust pipe 10 is connected to the exhaust part 6 and a controllable pressure controller is provided within this exhaust pipe 10 to maintain the treatment region A within the reaction tube 4 at a predetermined treatment pressure, such as from a few tenths of a Torr to 700 Torr. This pressure controller is formed of a multiple-function valve 11 provided with overlapping functions of a main valve, a shut-off valve, and a pressure control valve; a vacuum valve 12, and a filtering valve 13; disposed in sequence. The exhaust pipe 10 that is provided with the multiple-function valve 11 and other valves forms an exhaust system 14 together with the exhaust part 6. The configuration is such that a treatment gas emitted from the introduction part 5a of the gas introduction pipe 5 rises through the treatment region A within the inner tube 4a of the reaction tube 4 to provide a predetermined thermal treatment, in a state in which the treatment region A is controlled to a predetermined treatment pressure by the exhaust system 14, then it flows downward through the previously described annular passageway 9 between the inner tube 4a and the outer tube 4b and is exhausted from the exhaust part 6.

Flange portions 7a and 7b are formed integrally at the upper and lower ends of the manifold 7, and a lower flange portion 4g of the outer tube 4b is mounted on an upper surface of the upper flange portion 7a and is fixed thereto by an annular flange fixing member 15. In order to form a seal between the upper flange portion 7a of the manifold 7 and the lower flange portion 4g of the outer tube 4b, the configuration is such that, as shown in FIG. 2, the flange fixing member 15 is utilized in such a manner as to encompass the lower flange portion 4g of the outer tube 4b, and O-rings 16 and 17 as sealing members form seals at the engagement portion between the flange fixing member 15 and the lower flange portion 4g of the outer tube 4b and the engagement portion between the flange fixing member 15 and the upper flange portion 7a of the manifold 7. Note that another O-ring 17a may be interposed directly between the upper flange portion 7a of the manifold 7 and the lower flange portion 4g of the outer tube 4b, to form a seal.

In order to support the inner tube 4a on the inner side of the manifold 7, the annular inner flange portion 8 is formed on an inner peripheral portion of the manifold 7 and also a cylindrical inner tube support member 18 is provided within the inner flange portion 8 to support the lower end portion of the inner tube 4a. This support member 18 is formed in a cylindrical shape of a material having thermal durability and corrosion resistance, such as Inconel, and the manifold 7 and the inner flange portion 8 are preferably fixed together in a removable manner, as shown in FIGS. 2, 3A and 3B, by a plurality of circular-arc-shaped lugs 19 provided around the periphery of the internal support member 18 and an annular clamping plate 20 screwed onto the lower end thereof.

The manifold 7 is mounted onto a lower portion of a base plate 21 and a heater 22 that can be controlled to heat the treatment region A within the reaction tube 4 to a thermal treatment temperature of between 300 and 1100° C., by way of example, is disposed on an upper portion of this base plate 21. This heater 22 is mainly configured of a thermal insulating material in a cylindrical form, which surrounds the periphery including the upper part of the reaction tube 4, and a resistance-heating member provided around the inner periphery of this thermal insulating material, in a known manner.

In order to accommodate and hold a plurality of semiconductor wafers W that are objects to be treated (substrates to be treated), such as approximately 150 wafers, in the treatment region A within the reaction tube 4 in a horizontal state and separated in the vertical direction at a suitable spacing, the semiconductor wafers W are held in a wafer boat 23 that is a holding means, and this wafer boat 23 is mounted on an upper portion of a lid member 24 that can be raised and lowered to seal the furnace entrance 2, with an insulating cylinder 25 therebetween. The lid member 24 is formed of a material having thermal durability and corrosion resistance, such as stainless steel.

A loading area E is provided below the thermal treatment furnace 3, an elevator mechanism 26 is provided within this loading area E in order to cause the lid member 24 to rise or lower and convey the wafer boat 23 and the insulating cylinder 25 into or out of the furnace entrance 2, and the lid member 24 is mounted on an elevator arm 26a of this elevator mechanism 26. An O-ring 27 is provided in the engagement portion between the lower flange portion 7b of the manifold/and the lid member 24. Coolant passageways 28 that cause a coolant to circulate are provided in the upper flange portion 7a and the lower flange portion 7b of the manifold 7 as means of cooling to prevent thermal damage to the O-rings 16, 17, and 27.

To prevent the treatment gas introduced into the treatment region A from intruding into the furnace entrance 2 side, a purge gas introduction pipe 29 for introducing a purge gas is provided on the furnace entrance 2 side and also a throttle mechanism (a throttle part) 30 is provided between the treatment region A and the furnace entrance 2 (i.e. between the treatment region A and the purge gas introduction pipe 29) for accelerating the purge gas to a speed that is faster than the speed of diffusion of the treatment gas, to generate an upward counterflow thereof. The purge gas introduction pipe 29 is provided on an outer side of the side wall that is below the inner flange portion 8 of the manifold 7, in other words, upstream with respect to the upward flow of treatment gas from the treatment gas introduction port 5a of the gas introduction pipe 5. An inert gas such as argon is preferably used as the purge gas, but other gases such as nitrogen could also be used therefor. A molecular flow region of a few tenths of a Torr is useless as the pressure range within the thermal treatment furnace for generating a counterflow of purge gas that is faster than the diffusion speed of the treatment gas; so it is preferably between a few Torr and atmospheric pressure, but in actual practice it is preferably on the order of between 100 and 500 Torr.

The throttle mechanism 30 is provided in such a manner that an orifice-shaped passage 31 is formed between the manifold 7 and the insulating cylinder 25. The throttle mechanism 30 could be provided on the inside wall of the inner tube 4a, but it is preferably provided on the inner side of the cylindrical inner tube support member 18, as shown in FIGS. 2, 3A and 3B by way of example. This cylindrical internal support member 18 is erected higher than the inner flange portion 8 of the manifold 7, as shown, and the throttle mechanism 30 is created adjacent the insulating cylinder 25 by forming the upper end portion of the support member 18 into an upward-orientated flange that is L-shaped in section. In other words, the throttle mechanism 30 is formed to have an L-shaped section, comprising a horizontal portion 30a that extends horizontally in the inward radial direction from the upper end portion of the inner tube support member 18 and a cylindrical throttle portion 30b that stands vertically from the edge of the horizontal portion 30a, where the cylindrical throttle portion 30b is in proximity with the insulating cylinder 25 is such a manner that a throttled flow passage 31 is formed between the cylindrical throttle portion 30b and the insulating cylinder 25. The width C of the throttled passage 31 is between 1 mm and 15 mm, and is preferably on the order of 5 mm.

An annular groove 32 for positioning and mounting the inner tube 4a is formed in the upper end portion of the inner tube support member 18, together with the throttle mechanism 30. Note that cutouts 33 are provided in the throttle portion 30 in correspondence with the plurality of gas introduction pipes (injector pipes) 5, as shown in FIG. 3A, to prevent interference therewith.

The inner surfaces of the furnace entrance 2 of the thermal treatment furnace 3 and the inner surfaces of the exhaust system 14, where reaction by-products of the treatment gas can be assumed to adhere, have roughened surfaces (not shown) that are subjected to a surface-roughening process to suppress any peeling of those reaction by-products. The region over which the surface-roughening process is performed covers the inner surfaces (inner peripheral surfaces) of the manifold 7 and the inner surfaces of the exhaust system 14, including the exhaust part 6, but, since it is difficult for reaction by-products to occur at the low pressure of a few tenths of a Torr downstream of the multiple-function valve 11 and the filtering valve 13, the surface-roughening process need be performed only on the inner surfaces of the manifold 7 that are higher than the inner flange portion 8, the inner surfaces of the exhaust part 6, and the inner surfaces of the exhaust pipe 10 from the exhaust part 6 to the multiple-function valve 11. Note that the adhesion of reaction by-products onto the inner surfaces of the manifold 7 below the throttle mechanism 30 is restrained by the purging of the purge gas, but the surface-roughening process could also be performed on those inner surfaces and the inner surfaces of the lid member 24. This surface-roughening process could also be performed on the outer surfaces of the insulating cylinder 25.

Various different methods could be used for this surface-roughening process, such as buffing, a hairline treatment, particle-basting, or composite electrolytic abrasion, but sand blasting has been verified by experiments to be the most preferable of these methods. In these experiments, a plurality of samples that had been subjected to various surface-roughening processes were produced, and the times taken for reaction by-products to peel thereoff were measured. As a result, it was verified that a rough surface having a high degree of roughness, such as 1.31 $\mu$m on average, that was obtained by blowing glass beads of, for example, 150 to 250 $\mu$m onto the surfaces to be processed was highly effective in restraining the peeling of reaction by-products. In particular, it was also verified that an extended effect of ten times or more of the peeling time for an ordinary stainless steel surface could be obtained for a process that comprises arsenic.

It is also preferable to cover the inner peripheral wall surfaces of the manifold/above the inner flange portion 8 with a circular cylindrical protective cover member 34, to prevent corrosion due to contact with a treatment gas or a cleaning gas that is highly corrosive, such as hydrochloric acid (HCl) or the like. This protective cover member 34 has an annular inner flange 34a that extends over the upper surface of the inner flange portion 8.

The description now turns to the operation of the vertical thermal treatment apparatus of the above described configuration. First of all, after the wafer boat 23 holding a stack of many semiconductor wafers W has been mounted onto the lid member 24 that has been lowered into the loading area E, with the insulating cylinder 25 therebetween, the lid member 24 is raised to convey the wafer boat 23 into the treatment region A within the thermal treatment furnace 3 and also seal the furnace entrance 2 with the lid member 24. The interior of the furnace is then placed at a predetermined treatment pressure, such as several hundred Torr, by reduced-pressure evacuation from the exhaust part 6, a predetermined treatment gas such as arsine (AsH3) is introduced into the treatment region A in the upward direction from the gas introduction pipe 5 at the same time that a purge gas such as argon is introduced from the purge gas introduction pipe 29, and the treatment region A is heated to a predetermined treatment temperature by the heater 22. This subjects the semiconductor wafers W to a predetermined thermal treatment such as thermal diffusion. In this case, the treatment gas is introduced from the gas introduction pipe 5 at a rate of several hundred cc/minute and the purge gas is introduced from the purge gas introduction pipe 29 at a rate of approximately 1 liter/minute, by way of example.

During this thermal treatment process, the treatment gas is introduced into the inner tube 4a of the reaction tube 4 from the treatment gas introduction port 5a at the upper ends of the gas introduction portions 5, it subjects the semiconductor wafers W within the treatment region A to the thermal treatment as it rises within the inner tube 4a, then if flows down through the annular passageway 9 between the inner tube 4a and the outer tube 4b and is exhausted from the exhaust part 6 of the manifold 7. In this case, the treatment gas attempts to diffuse towards the lower furnace entrance 2 side from the treatment region A, but, since the throttle mechanism 30 is provided between the treatment region A and the furnace entrance 2 and also the purge gas is introduced from below the throttle mechanism 30, the throttled flow passage 31 that is constricted by the throttle mechanism 30 accelerates the purge gas to a flowrate that is faster than the diffusion speed of the treatment gas, so that intrusion of the treatment gas into the side of the furnace entrance 2 is prevented or restrained by the counterflow that causes a flow towards the side of the treatment region A. During this time, the treatment gas is basically supplied as an upward flow from the treatment gas introduction port 5a of the gas introduction pipe 5 and thus the flow of purge gas directed upward through the throttled flow passage 31 from upstream of this upward flow need only be sufficient to overcome the downward diffusion of the treatment gas, so that it is sufficient to reduce the upward flowrate of purge gas in comparison with the vertical thermal treatment apparatus disclosed in Japanese Patent Application Laid-Open No. 10-223538, thereby ensuring that large quantities of inert gas do not mix into the thermal treatment gas during the thermal treatment.

In this manner, since there is no treatment gas flowing into the furnace entrance, either no reaction by-products are generated in the portions around the furnace entrance or, if they are generated, only a small quantity thereof is generated. This makes it possible to eliminate or restrain the adhesion of reaction by-products onto the portions around the furnace entrance where there is danger of exposure during loading in the loading area E that is a maintenance area. It is, therefore, possible to eliminate the heater for processes wherein such a heater is used in the portions around the furnace entrance in the prior art, simplifying the apparatus. This is particularly effective for processes comprising arsenic, where such a heater is not very effective, which is an effective measure towards protecting the health of operators.

Since the treatment gas does come into contact with the inner surfaces of the manifold 7 on the exhaust side and with the inner surfaces of the exhaust system 14 including the exhaust part 6, on the other hand, reaction by-products are readily generated therein. However, the inner surfaces of the manifold 7 where it is assumed that reaction by-products will adhere (more specifically, the inner surfaces that are higher than the inner flange portion 8) and the inner surfaces of the exhaust system 14 including the exhaust part 6 (more specifically, the inner surfaces of the exhaust part 6 and the inner surfaces of the exhaust pipe 10 from the exhaust part 6 to the multiple-function valve 11) are subjected to a surface-roughening process to restrain the peeling of reaction by-products therefrom, so peeling does not readily occur even if such reaction by-products adhere thereto. This makes it possible to either prevent or restrain the generation of particles, which is also effective from the point of view of operators' health. In addition, cleaning need only be performed every ten runs, instead of after every run in the prior art, carried out in view of the peeling periods of reaction by-products, so that the spacing of periodic cleaning can be greatly increased, thus improving the processing capability.

Figure 4:
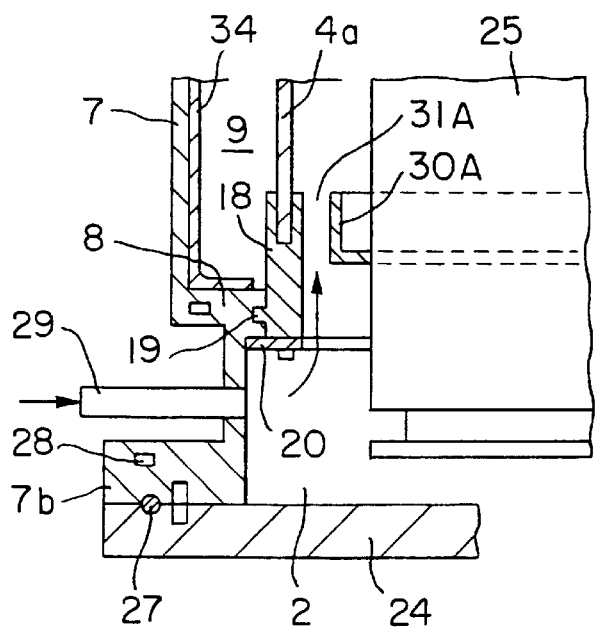
FIG. 4 is an enlarged section through essential components of another embodiment of this invention.

Another embodiment of this invention is shown in FIG. 4. Although the embodiment shown in FIG. 2 has the throttle mechanism 30 that is formed integrally with the inner tube support member 18, a throttle portion 30A of the embodiment of FIG. 4 is fixed to the outer periphery of the insulating cylinder 25 and a throttled flow passage 31A is formed between the inner tube 4a and an outer, vertical, cylindrical, peripheral surface of the throttle portion 30A. This throttled flow passage 31A is also formed to have a width close to that of the throttled flow passage 31.

Figure 5:
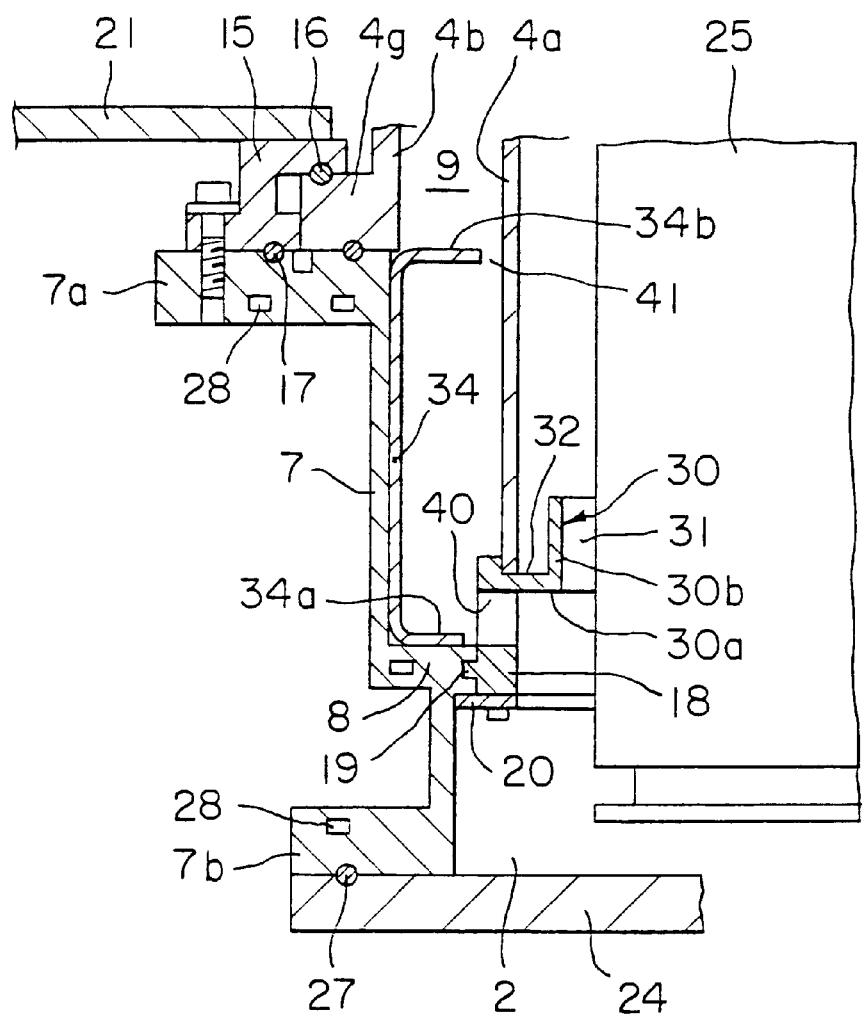
FIG. 5 is a vertical section through a further embodiment of this invention.
Figure 6:
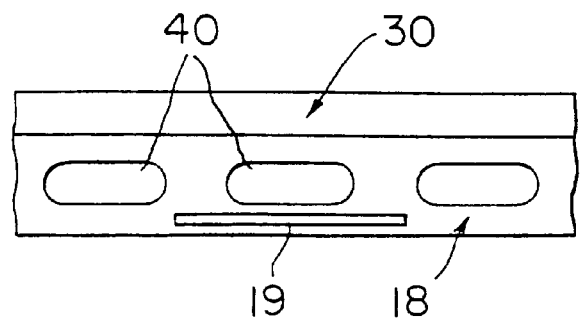
FIG. 6 is a partial side view of the inner tube support member shown in FIG. 5.

A further embodiment of this invention is shown in FIGS. 5 and 6. Components that are the same as those in FIG. 2 are denoted by the same reference numbers and further description thereof is omitted. To describe only portions thereof that are different: the purge gas introduction pipe 29 shown in FIG. 2 is not provided, a plurality of apertures 40 are formed in the inner tube support member 18 that has the throttle mechanism 30, and an annular flange 34b is formed so as to be directed radially inward from the upper edge portion of the circular cylindrical protective cover member 34, so that a low-conductance throttle mechanism (low-conductance throttle part) 41 is formed as if to constrict the orifice between the edge of the annular flange 34b and the inner tube 4a. The apertures 40 communicate between the furnace entrance 2 and the annular passageway 9, and they can be formed as horizontally elongated slots, as shown in FIG. 6.

In the embodiment shown in FIGS. 5 and 6, the throttle mechanism 41 is provided downstream within the inner tube 4a but upstream of the manifold 7, more preferably further upstream from the manifold 7 in the annular passageway 9 between the inner tube 4a and the outer tube 4b (including the upper edge position of the manifold 7), so that a pressure difference is generated between the upstream side (the treatment region side) and the downstream side (the non-treatment region side), with the throttle mechanism 41 being the boundary, and thus the region above the inner flange portion 8 within the manifold 7 is at a pressure that is lower than the treatment pressure on the upstream side. In addition, the apertures 40 are provided to communicate between the interior and exterior of the inner tube 4a below the inner tube 4a, in other words, in the inner tube support member 18, and the throttle mechanism 30 is provided above the apertures 40 within the inner tube 4a, so that the region below the throttle mechanism 30 (which in this case is a non-treatment region) is evacuated and exhausted through the apertures 40, a pressure difference is generated between the upstream side (the treatment region side) and the downstream side (the non-treatment region side), with the throttle mechanism 30 being the boundary, and thus the region below the inner flange portion 8 within the manifold 7 is at a pressure that is lower than the treatment pressure on the upstream side. If, by way of example, the treatment pressure in the treatment region is 400 Torr, the pressure in regions outside the treatment region is (400–) Torr, where is from 100 to 399 Torr.

By reducing the pressure within the interior of the manifold 7, which is a region outside the treatment region, to below the treatment pressure of the treatment region in this manner, it becomes possible to sublimate reaction by-products and deposits, even at the vapor pressures that exist at comparatively low temperatures, and this makes it possible to restrain the adhesion of reaction by-products and deposits onto the inner surfaces of the manifold 7 of the vertical thermal treatment apparatus 1. This is, therefore, effective in restraining the adhesion of deposits during diffusion processing at low pressures on the order of 50 to 700 Torr at comparatively high temperatures, when using chemicals such as $AsH_3$ or $PH_3$, and also in restraining the adhesion of reaction by-products during $Si_3N_4$ or TEOS processing with CVD. This also leads to a simplification of the prior-art techniques, even when a manifold heater is used with this embodiment, because it is sufficient to employ a comparatively simple heater and a low temperature.

Figure 7:
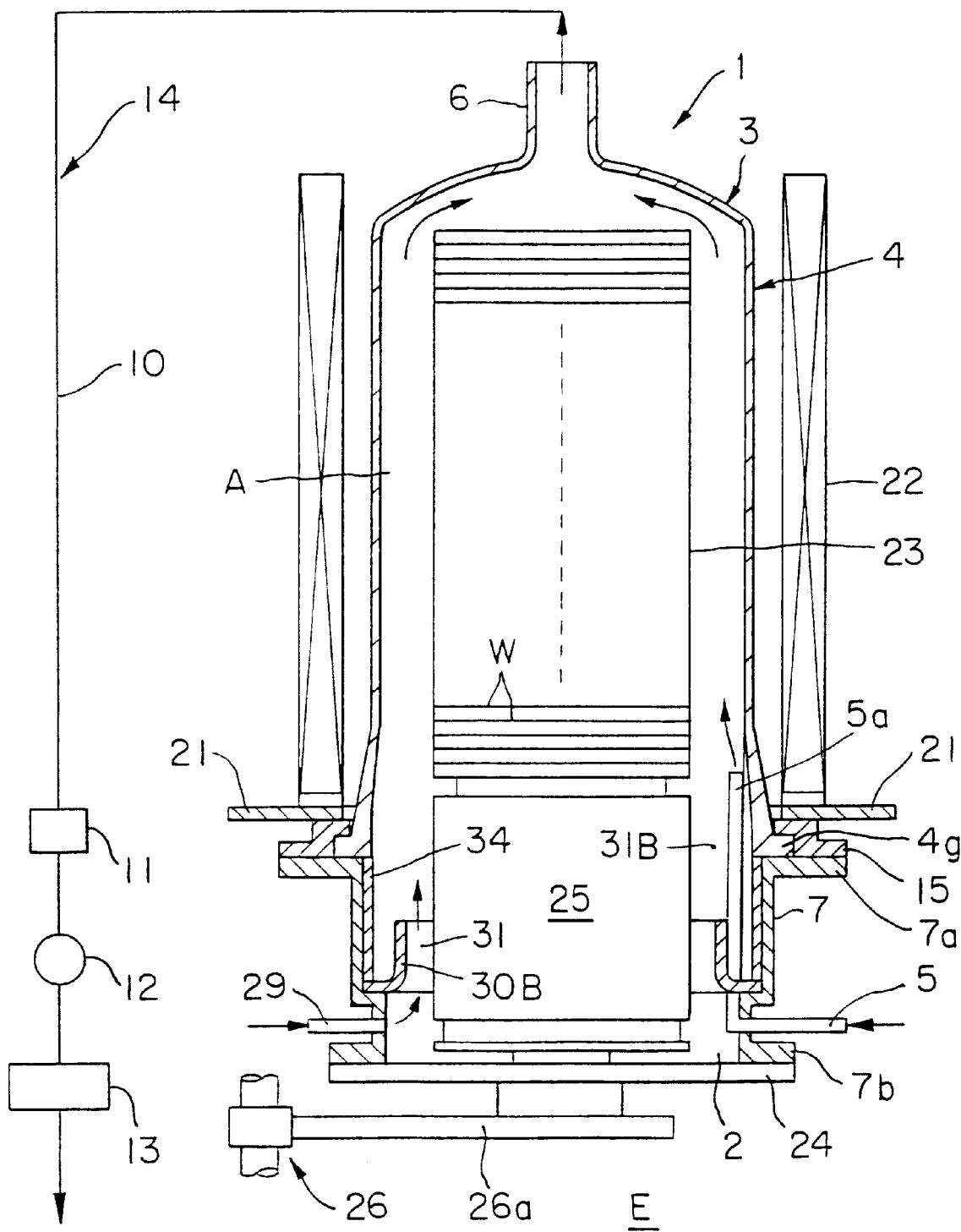
FIG. 7 is a vertical sectional view showing a still further embodiment of the thermal treatment apparatus of this invention.

A still further embodiment of the thermal treatment apparatus of this invention is shown in FIG. 7. Members and portions in FIG. 7 that are the same as those in FIG. 1, or are substantially equivalent thereto, are denoted by the same reference numbers and further description thereof is omitted. In this embodiment, the reaction tube 4 has a single-tube structure instead of the double-tube structure of FIG. 1, which has an inner tube and an outer tube. There is no annular passageway 9 for exhaust between the inner tube 4a and the outer tube 4b of FIG. 1, and the configuration is such that exhaust is performed by the exhaust system 14 through an exhaust part 6 which is provided at the top of the single-tube reaction tube 4. Since the exhaust part 6 is at the top, no exhaust part is provided in the side surface of the manifold 7. The inner tube support member 18 that is supported within the manifold 7 in FIG. 1 is also not provided, and a cylindrical throttle mechanism (cylindrical throttle part) 30B is attached in the vicinity of the inner side of the protective cover member 34. A cylindrical portion of the throttle mechanism 30B defines the annular throttled flow passage 31 with the outer peripheral surface of the insulating cylinder 25. The throttle mechanism 30B is positioned above the purge gas introduction pipe 29 and also on the upstream side with respect to the upward flow of the treatment gas emitted from the treatment gas introduction port 5a, in a similar manner to that shown in FIG. 1. This embodiment of the invention differs from the embodiment shown in FIG. 1 only in the manner in which gases are exhausted; all other basic operations are the same as those of the embodiment of FIG. 1.

Figure 8:
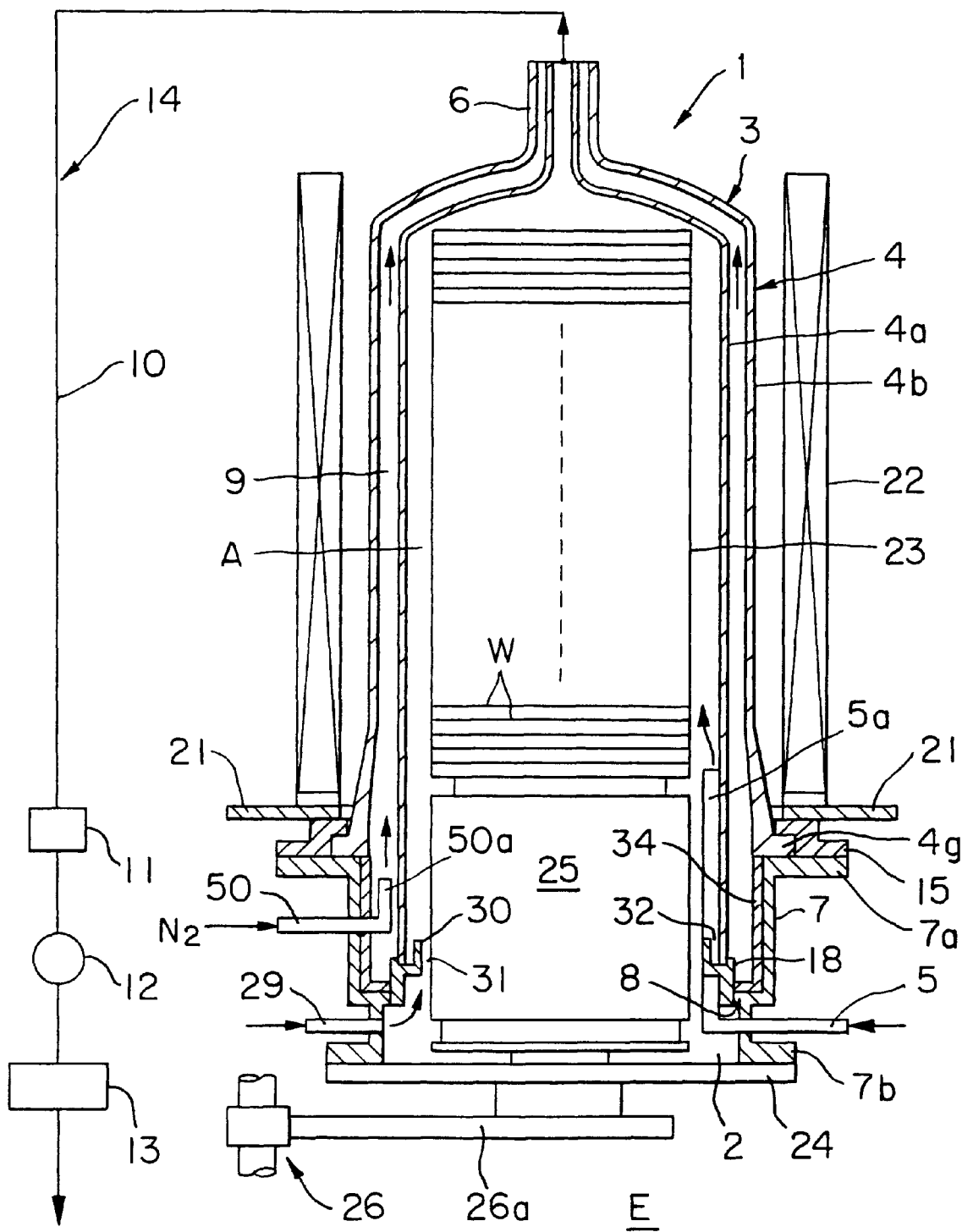
FIG. 8 is a vertical sectional view showing an even further embodiment of the thermal treatment apparatus of this invention.

An even further embodiment of the thermal treatment apparatus of this invention is shown in FIG. 8. Members and portions in FIG. 8 that are the same as those in FIG. 1, or are substantially equivalent thereto, are denoted by the same reference numbers and further description thereof is omitted. In this embodiment, a double-tube structure that is the same as that of the embodiment of FIG. 1 is employed, and the annular passageway 9 is formed between the inner tube 4a and the outer tube 4b. However, this annular passageway 9 is not used for exhaust. Exhaust is extracted by the exhaust system 14 from an exhaust part 6 provided in the top of the reaction tube 4, in the same way as that of the embodiment of FIG. 7. It should be noted, however, that the exhaust part 6 of this embodiment is provided at the top of each of the inner tube 4a and the outer tube 4b of the double-wall structure. Beyond the exhaust portion 6, the exhaust system 14 is formed of a common single pipe. Instead of being used for exhaust of the treatment gas, the annular passageway 9 in this embodiment of the invention forms a passageway for an inert gas such as $N_2$ that is supplied as an upward flow from an inert gas introduction port 50a of an inert gas introduction portion 50 disposed at a lower portion within the annular passageway 9. The inert gas flowing upward from the inert gas introduction port 50a rises within the annular passageway 9, covers the upper portion and top of the outer tube 4b and the outer surfaces of the inner tube 4a, and thus prevents the formation of any film or the like on the surfaces of the upper portion of the annular passageway 9 due to components in the treatment gas that is rising up through the treatment region a, and flowing backwards from within the beginning portion of the exhaust system 14. The configuration and operation of the throttle mechanism 30 in this embodiment are the same as those of the embodiment of FIG. 1, so further description thereof is omitted.

Although the present invention has been described above by way of specific embodiments with reference to the drawings, this invention is not limited to those embodiments and various design modifications are possible within the scope of the invention laid out herein. This invention can also be applied to apparatuses other that a vertical thermal treatment apparatus, such as a single-wafer thermal treatment apparatus or a horizontal thermal treatment apparatus. The objects to be treated are not limited to semiconductor wafers and thus may be glass substrates of LCD substrates, by way of example.

Each of the above embodiments exemplified a thermal treatment apparatus that has both the function of restraining the adhesion of reaction by-products and the function of restraining the peeling of any adhered reaction by-products, but a thermal treatment apparatus in accordance with this invention may equally well be one that has only the function of restraining the adhesion of reaction by-products or one that has only the function of restraining the peeling of any adhered reaction by-products. Similarly, this invention is not limited to processes that include arsenic; it is equally effective for processes that use other treatment gases that have toxic properties, such as phosphine ($PH_3$).

The invention as described above can achieve the following effects:

(1) In a thermal treatment apparatus wherein objects to be treated are accommodated in a treatment region within a thermal treatment furnace and are sealed therein, and the objects to be treated are subjected to a thermal treatment by a predetermined treatment gas at a treatment temperature and pressure, a purge gas introduction portion is provided on the furnace entrance side and also a throttle mechanism for generating a counterflow of accelerated purge gas that is faster than the diffusion speed of the treatment gas between the treatment region and the furnace entrance, in order to prevent the treatment gas that is introduced into the treatment region from intruding into the furnace entrance side. Due to the above stated features, it is possible to restrain the adhesion of reaction by-products onto portions around the furnace entrance. Moreover, the flowrate of purge gas can be reduced in comparison with the prior-art technique, so that it is difficult for the inert gas to mix in with the treatment gas.

It is, therefore, possible to eliminate the heater for processes that would otherwise use a heater in the peripheral portions of the furnace entrance, simplifying the apparatus. In addition, this is particularly effective for processes using arsenic, where a heater would not be very efficacious, which is useful for protecting the health of operators.

(2) In a thermal treatment apparatus wherein objects to be treated are accommodated in a treatment region within a thermal treatment furnace and are sealed therein, and the objects to be treated are subjected to a thermal treatment by a predetermined treatment gas at a treatment temperature and pressure, roughened surfaces are provided on the inner surfaces of the furnace entrance of the thermal treatment furnace and the inner surfaces of the exhaust system where it is assumed that reaction by-products will adhere, to restrain any peeling of those reaction by-products. Due to this feature, it is possible to solve the problem of particle generation without any peeling, making it possible to greatly extend the spacing of periodic cleaning, thus improving the processing capability.

What is claimed is:

1. A thermal treatment apparatus comprising:

a thermal treatment furnace having a vertical reaction tube and provided in a lower portion thereof with a furnace entrance capable of being opened and closed to allow conveying in and out of objects to be treated, said reaction tube including an outer tube closed at an upper portion but opened at a lower portion and an inner tube provided within said outer tube and forming a thermal treatment region therein, said inner tube being open at both upper and lower portions thereof and forming together with said outer tube an annular space for exhausting a treatment gas in a downward direction;

a treatment gas introduction pipe provided within said inner tube to introduce a treatment gas into said thermal treatment region and having at an upper end thereof a treatment gas introduction port for generating an upwardly directed flow of the treatment gas directed toward an upper portion of said inner tube through said thermal treatment region within said inner tube, said upwardly directed flow of treatment gas performing a thermal treatment with respect to an object to be treated within said thermal treatment region, and then being directed to flow downward within said annular space;

a purge gas introduction pipe positioned at a lower portion of said inner tube and below said treatment gas introduction port, and on an upstream side with respect to said upwardly directed flow or treatment gas emitted from said treatment gas introduction port, for introducing a purge gas directed upward within said thermal treatment region; and a purge gas throttle mechanism provided between said thermal treatment region and said purge gas introduction pipe, for accelerating said purge gas introduced from said purge gas introduction pipe, thus generating a counterflow in a direction opposite to a direction of diffusion of said treatment gas, at a speed faster than a speed at which said treatment gas introduced from said treatment gas introduction port into said thermal treatment region diffuses towards said furnace entrance, in order to prevent said treatment gas introduced into said thermal treatment region from intruding into said furnace entrance.

2. The thermal treatment apparatus as defined in claim 1, wherein said furnace entrance is configured of an inner space within a cylindrical manifold that is fixed to a lower portion of said thermal treatment furnace, said purge gas introduction pipe is provided within said manifold, and said purge gas throttle mechanism is configured of a cylindrical body fixed above said purge gas introduction portion.

3. The thermal treatment apparatus as defined in claim 2, wherein said cylindrical body that configures said purge gas throttle mechanism is fixed to an inner side of said manifold.

4. The thermal treatment apparatus as defined in claim 3, wherein said cylindrical body that configures said purge gas throttle mechanism is provided with a cylindrical support member fixed to an inner side of said manifold, and a cylindrical throttle mechanism provided on an upper portion of said cylindrical support member and having a diameter less than that of a cylindrical support member.

5. The thermal treatment apparatus as defined in claim 4, further comprising an annular horizontal portion provided between, and connecting said cylindrical support member and said cylindrical throttle mechanism.

6. The thermal treatment apparatus as defined in claim 4, wherein said cylindrical support member is provided in an upper portion thereof with means for supporting said vertical inner tube defining said thermal treatment region within said thermal treatment furnace.

7. The thermal treatment apparatus as defined in claim 2, wherein said cylindrical manifold is provided in an upper portion thereof with a supporter for supporting said outer tube.

8. The thermal treatment apparatus as defined in claim 2, wherein said cylindrical manifold has an inner surface facing an outer surface of said inner tube, and said inner surface of said cylindrical manifold is provided with a cylindrical protective cover member.

9. The thermal treatment apparatus as defined in claim 2, wherein a thermal insulating cylinder is provided facing an inner side of said purge gas throttle mechanism, and an annular throttled passage for throttling said purge gas is formed between an outer surface of said thermal insulating cylinder and said purge gas throttle mechanism.

10. The thermal treatment apparatus as defined in claim 1, wherein a thermal insulating cylinder is provided and said purge gas throttle mechanism is affixed to an outer surface of said thermal insulating cylinder.

11. The thermal treatment apparatus as defined in claim 1, wherein said furnace entrance is configured of an inner space within a cylindrical manifold fixed to a lower portion of said thermal treatment furnace, said purge gas introduction pipe is provided within said manifold, and an inner surface of said manifold is formed as a surface-roughened portion in a region above said purge gas introduction pipe.

12. The thermal treatment apparatus as defined in claim 11, wherein said furnace entrance is provided with a lid member for sealing from a lower portion thereof in an openable manner, and an upper portion of said lid member is formed as a surface-roughened portion.

13. The thermal treatment apparatus as defined in claim 1, further comprising:

an exhaust system comprising an exhaust pipe for exhausting the interior of said thermal treatment furnace; and surface-roughened portions provided on an inner surface of said furnace entrance and an inner surface of said exhaust pipe, where it is assumed that reaction by-products of said treatment gas will adhere, to suppress peeling of said reaction by-products therefrom.

14. A thermal treatment apparatus comprising:

a thermal treatment furnace having a vertical reaction tube forming a thermal treatment region therein and provided with a furnace entrance capable of being opened and closed to allow conveying in and out of objects to be treated;

a treatment gas introduction pipe provided in an interior of said reaction tube for introducing a treatment gas into said thermal treatment region and having at an upper end thereof a treatment gas introduction port for generating an upwardly directed flow of a treatment gas directed toward an upper portion of said reaction tube through said thermal treatment region within said reaction tube, said upwardly directed flow of treatment gas performing a thermal treatment with respect to an object to be treated within said thermal treatment region;

a purge gas introduction pipe positioned at a lower portion of said reaction tube and below said treatment gas introduction port, and on an upstream side with respect to said upwardly directed flow of treatment gas emitted from said treatment gas introduction port, for introducing a purge gas directed upward within said thermal treatment region; and a purge gas throttle mechanism provided between said thermal treatment region and said purge gas introduction pipe, for accelerating said purge gas introduced from said purge gas introduction pipe, thus generating a counterflow in a direction opposite to a direction of diffusion of said treatment gas, at a speed faster than a speed at which said treatment gas introduced from said treatment gas introduction port into said thermal treatment region diffuses towards said furnace entrance, in order to prevent said treatment gas introduced into said thermal treatment region from intruding into said furnace entrance.

15. The thermal treatment apparatus as defined in claim 14, wherein said furnace entrance is configured of an inner space within a cylindrical manifold fixed to a lower portion of said thermal treatment furnace, said purge gas introduction pipe is provided within said manifold, and said purge gas throttle mechanism is configured of a cylindrical body that is fixed above said purge gas introduction pipe.

16. The thermal treatment apparatus as defined in claim 15, wherein said cylindrical body configuring said purge gas throttle mechanism is fixed to an inner side of said manifold.

17. The thermal treatment apparatus as defined in claim 14, wherein a thermal insulating cylinder is provided facing an inner side of said purge gas throttle mechanism, and an annular throttled passage for throttling said purge gas is formed between a surface of said thermal insulating cylinder and said purge gas throttle mechanism.

18. A thermal treatment apparatus comprising:

a thermal treatment furnace having a vertical reaction tube and provided in a lower portion thereof with a furnace entrance capable of being opened and closed to allow conveying in and out of objects to be treated, said reaction tube having an outer tube open at a lower portion and an inner tube provided within said outer tube, which forms a thermal treatment region therein and is also open at both upper and lower portions, and which forms together with said outer tube an annular space;

a treatment gas introduction pipe provided within said inner tube to introduce a treatment gas into said thermal treatment region and having at an upper end thereof a treatment gas introduction port for generating an upwardly directed flow of a treatment gas directed toward an upper portion of said inner tube through said thermal treatment region within said inner tube;

a purge gas introduction pipe positioned at a lower portion of said inner tube and below said treatment gas introduction port, and on an upstream side with respect to said upwardly directed flow of treatment gas emitted from said treatment gas introduction port, for introducing a purge gas directed upward within said thermal treatment region;

a purge gas throttle mechanism provided between said thermal treatment region and said purge gas introduction pipe, for accelerating said purge gas introduced from said purge gas introduction pipe, thus generating a counterflow in a direction opposite to a direction of diffusion of said treatment gas, at a speed faster than a speed at which said treatment gas introduced from said treatment gas introduction port into said thermal treatment region diffuses towards said furnace entrance, in order to prevent said treatment gas introduced into said thermal treatment region from intruding into said furnace entrance; and an exhaust system connected to an upper portion of said outer tube.

19. The thermal treatment apparatus as defined in claim 18, wherein said furnace entrance is configured of an inner space within a cylindrical manifold fixed to a lower portion of said thermal treatment furnace, said purge gas introduction pipe is provided within said manifold, and said purge gas throttle mechanism is configured of a cylindrical body fixed above said purge gas introduction pipe.

20. The thermal treatment apparatus as defined in claim 19, wherein said cylindrical body configuring said purge gas throttle mechanism is fixed to an inner side of said manifold.

21. The thermal treatment apparatus as defined in claim 19, wherein said cylindrical body configuring said purge gas throttle mechanism is provided with a cylindrical support member fixed to an inner side of said manifold, and a cylindrical throttle portion provided on an upper portion of said cylindrical support member and having a diameter less than that of the cylindrical support member.

22. The thermal treatment apparatus as defined in claim 21, further comprising an annular horizontal portion provided between, and connecting said cylindrical support member and said cylindrical throttle portion.

23. The thermal treatment apparatus as defined in claim 21, wherein said cylindrical support member is provided in an upper portion thereof with a supporter for supporting said vertical inner tube that defines said thermal treatment region within said thermal treatment furnace.

24. The thermal treatment apparatus as defined in claim 19, wherein said cylindrical manifold is provided in an upper portion thereof with a supporter for supporting said outer tube.

25. The thermal treatment apparatus as defined in claim 19, wherein said cylindrical manifold has an inner surface facing an outer surface of said inner tube, and said inner surface of said cylindrical manifold is provided with a cylindrical protective cover member.

26. The thermal treatment apparatus as defined in claim 19, wherein a thermal insulating cylinder is provided facing an inner side of said purge gas throttle mechanism, and an annular throttled passage for throttling said purge gas is formed between a surface of said thermal insulating cylinder and said purge gas throttle mechanism.

* * * * *